(12) United States Patent
Shen

(10) Patent No.: US 9,119,320 B2
(45) Date of Patent: Aug. 25, 2015

(54) SYSTEM IN PACKAGE ASSEMBLY

(71) Applicant: Quanta Computer Inc., Kuei Shan Hsiang, Tao Yuan Shien (TW)

(72) Inventor: Li-Cheng Shen, Tao Yuan Shien (TW)

(73) Assignee: QUANTA COMPUTER INC., Guishan Dist., Taoyuan (TW)

( * ) Notice: Subject to any disclaimer, the term of this patent is extended or adjusted under 35 U.S.C. 154(b) by 239 days.

(21) Appl. No.: 13/783,722

(22) Filed: Mar. 4, 2013

(65) Prior Publication Data

US 2013/0271924 A1  Oct. 17, 2013

(30) Foreign Application Priority Data

Apr. 13, 2012 (TW) .............................. 101131121 A

(51) Int. Cl.
| | |
|---|---|
| H05K 1/18 | (2006.01) |
| H05K 13/00 | (2006.01) |
| H01L 23/13 | (2006.01) |
| H01L 25/16 | (2006.01) |
| H01L 23/31 | (2006.01) |
| H01L 23/495 | (2006.01) |
| H01L 23/498 | (2006.01) |
| H05K 1/11 | (2006.01) |
| H05K 3/34 | (2006.01) |

(52) U.S. Cl.
CPC ............... *H05K 1/181* (2013.01); *H01L 23/13* (2013.01); *H01L 23/49827* (2013.01); *H05K 1/182* (2013.01); *H05K 1/184* (2013.01); *H05K 3/3436* (2013.01); *H05K 13/00* (2013.01); *H01L 23/3128* (2013.01); *H01L 23/49551* (2013.01); *H01L 23/49805* (2013.01); *H01L 25/16* (2013.01); *H01L 2924/0002* (2013.01); *H05K 1/117* (2013.01); *H05K 3/3426* (2013.01); *H05K 2201/10946* (2013.01); *H05K 2201/10962* (2013.01); *Y10T 29/49147* (2015.01)

(58) Field of Classification Search
CPC .................................. H05K 1/18; H05K 13/00
See application file for complete search history.

(56) References Cited

U.S. PATENT DOCUMENTS 5,317,479 A * 5/1994 Pai et al. ....................... 361/773
5,834,840 A * 11/1998 Robbins et al. ............... 257/705
(Continued)

FOREIGN PATENT DOCUMENTS

| JP | 5-13647 | 1/1993 |
|---|---|---|
| TW | I376574 | 12/1999 |

(Continued)

OTHER PUBLICATIONS

English language translation of abstract of JP 5-13647 (published Jan. 22, 1993).
English language translation of abstract of TW I376574 (published Dec. 11, 1999).
English language translation of abstract of TW 200828527 (published Jul. 1, 2008).

(Continued)

*Primary Examiner* — Hoa C Nguyen
*Assistant Examiner* — Xanthia C Cunningham
(74) *Attorney, Agent, or Firm* — McClure, Qualey & Rodack, LLP

(57) ABSTRACT

A printed circuit board assembly is disclosed, including a printed circuit board including at least one opening, and a system in package assembly, wherein the system in package assembly includes a system in package module and a lead frame bonded to the system in package module. The lead frame includes a plurality of pins. The system in package assembly is embedded into the opening of the printed circuit board.

1 Claim, 10 Drawing Sheets

(56) References Cited

U.S. PATENT DOCUMENTS

| | | | |
|---|---|---|---|
| 5,923,538 A * | 7/1999 | Hawthorne | 361/774 |
| 6,291,894 B1 * | 9/2001 | Farnworth et al. | 257/780 |
| 6,940,013 B2 * | 9/2005 | Vinciarelli et al. | 174/541 |
| 7,582,834 B2 * | 9/2009 | Lee | 174/260 |
| 8,115,112 B2 * | 2/2012 | Corisis et al. | 174/264 |
| 8,179,692 B2 * | 5/2012 | Ihara | 361/787 |
| 2001/0045636 A1 * | 11/2001 | Yamaguchi | 257/686 |
| 2002/0113663 A1 * | 8/2002 | Anthony et al. | 333/12 |
| 2002/0172022 A1 * | 11/2002 | DiBene et al. | 361/761 |
| 2004/0100778 A1 * | 5/2004 | Vinciarelli et al. | 361/760 |
| 2004/0223309 A1 * | 11/2004 | Haemer et al. | 361/767 |
| 2006/0067064 A1 * | 3/2006 | Crews et al. | 361/761 |

FOREIGN PATENT DOCUMENTS

| | | |
|---|---|---|
| TW | 200828527 | 7/2008 |
| TW | 200830495 | 7/2008 |
| TW | 201007908 | 2/2010 |

OTHER PUBLICATIONS

English language translation of abstract of TW 200830495 (published Jul. 16, 2008).

English language translation of abstract of TW 201007908 (published Feb. 16, 2010).

* cited by examiner

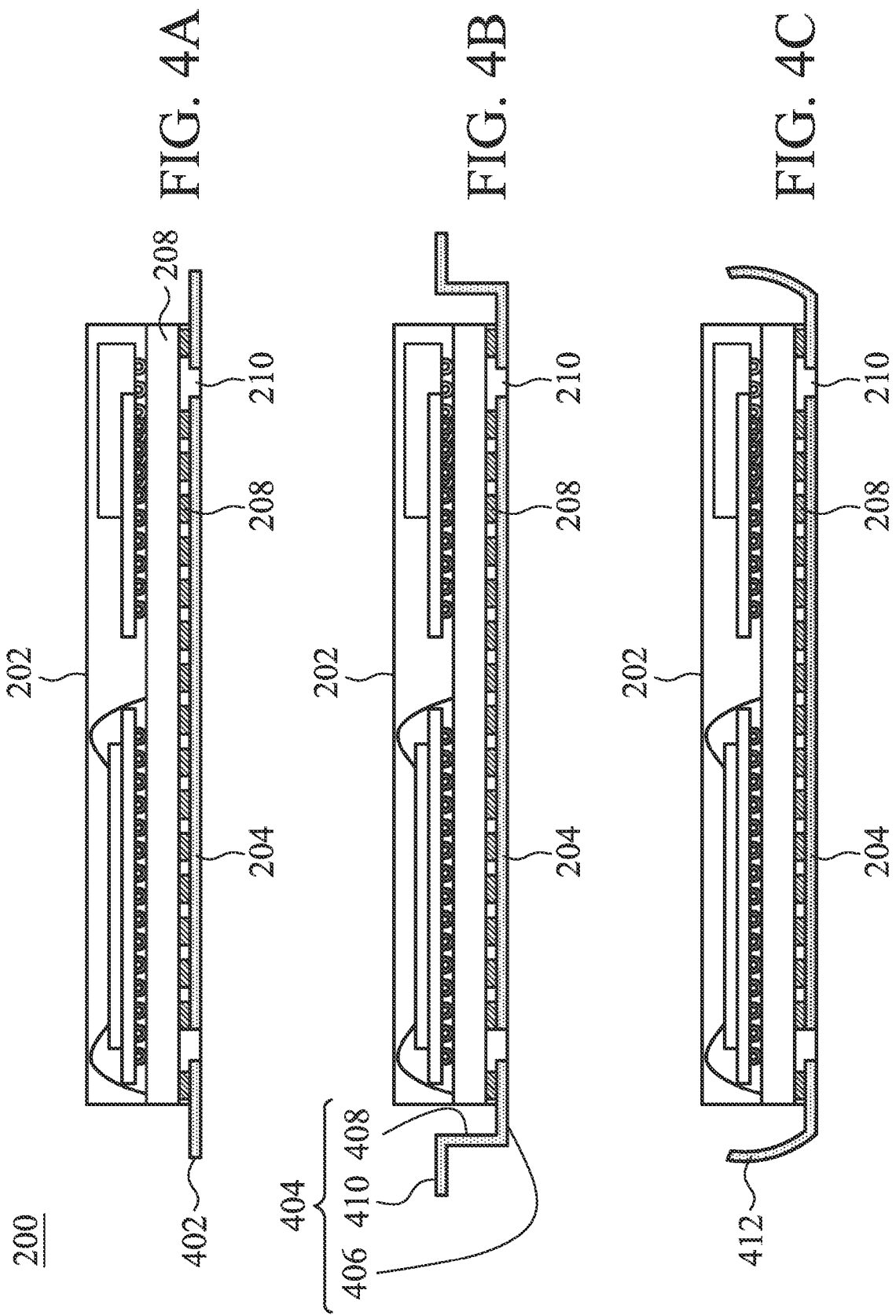

SYSTEM IN PACKAGE ASSEMBLY

CROSS-REFERENCE TO RELATED APPLICATION

This application claims priority of Taiwan Patent Application No 101113121, filed on Apr., 13, 2012, the entirety of which is incorporated by reference herein.

BACKGROUND OF THE INVENTION

1. Field of the Invention

This invention generally relates to an electronic assembly, and more particularly, to a system in package (SIP) assembly.

2. Description of the Related Art

Conventional technology uses full-mini cards or half-mini cards as connectors of a portable computer. However, due to miniaturization of portable computers, full-mini cards and half-mini cards with bigger sizes, requiring machinery components such as screws, are not appropriate for small-sized portable computers. Thus, board-to-board connection technology has been developed, which has a smaller size. However, this technology still cannot meet requirements of small-sized portable computers.

Accordingly, system in package (SIP) technology, having high density and arranging a plurality of integrated circuits in a package module, has been developed. System in package, having heterogeneous integration, is widely used in many fields since system in package has a heterogeneous integration which integrates different semiconductor processing technologies and devices having different functions. Specifically, the system in package can be applied to diversified products requiring large memories, such as digital cameras, MP3 players and portable phones.

As shown in FIG. 1, the current technology uses solders 106 to connect a system in package module to a printed circuit board 102. However, reworking or assembly changes are difficult. In addition, heat generated in the system in package module 104 can only sink through the solders 106, such that the heat dissipation of a system in package cannot meet requirements of modules having high density and small sizes.

Therefore, a package assembly having a small size, not requiring mechanical parts is required for products having high density.

BRIEF SUMMARY OF INVENTION

The invention provides a printed circuit board assembly comprising a printed circuit board comprising at least one opening, and a system in package assembly, wherein the system in package assembly comprises a system in package module and a lead frame bonded to the system in package module. The lead frame comprises a plurality of pins. The system in package assembly is embedded into the opening of the printed circuit board.

The invention further provides a method for forming a system in package assembly, comprising providing a system in package module comprising a plurality of bonding pads, bonding a lead frame to the bonding pads of the system in package module, wherein the lead frame comprises a plurality of pins, and performing a shape forming step to the pins of the lead frame for the pins to form a specific shape.

BRIEF DESCRIPTION OF DRAWINGS

The invention can be more fully understood by reading the subsequent detailed description and examples with references made to the accompanying drawings, wherein.

FIG. 4A shows a cross section a system in package assembly of another embodiment of the invention.

FIG. 4B shows a cross section a system in package assembly of another embodiment of the invention.

FIG. 4C shows a cross section a system in package assembly of another embodiment of the invention.

DETAILED DESCRIPTION OF INVENTION

It is understood that specific embodiments are provided as examples to teach the broader inventive concept, and one of ordinary skill in the art can easily apply the teaching of the present disclosure to other methods or apparatus. The following discussion is only used to illustrate the invention, not limit the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

The invention provides a package assembly which has a small size, and does not require mechanical parts, while meeting requirements of high density, improved heat sink, being easy to rework and change assembly and being thin when packaged with a system.

Figure 2A:
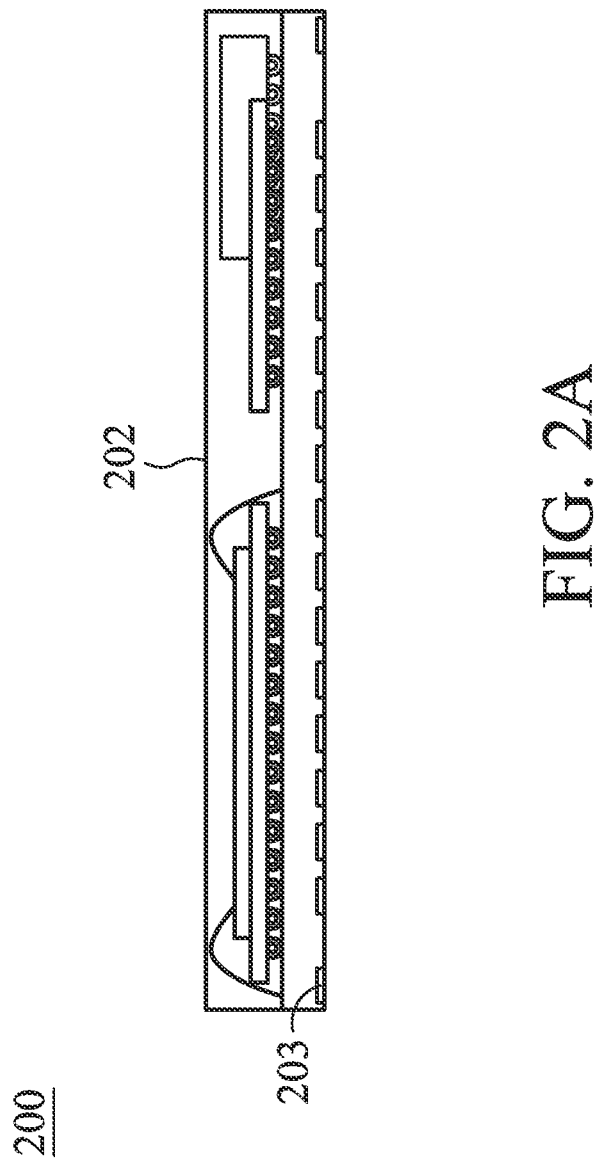
FIG. 2A shows a cross section of an intermediate stage of a method for forming a system in package assembly of an embodiment of the invention.
Figure 2B:
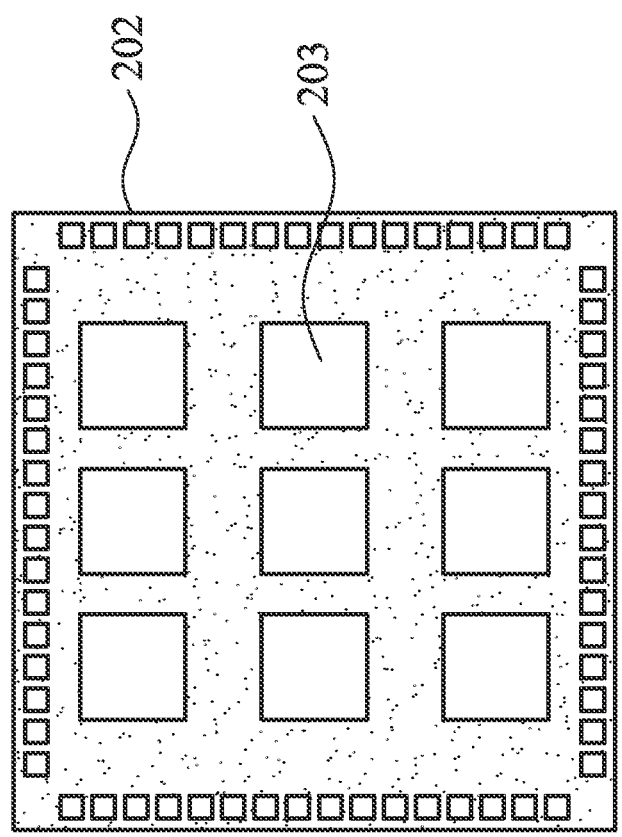
FIG. 2B shows a cross section of an intermediate stage of a method for forming a system in package assembly of an embodiment of the invention.
Figure 3A:
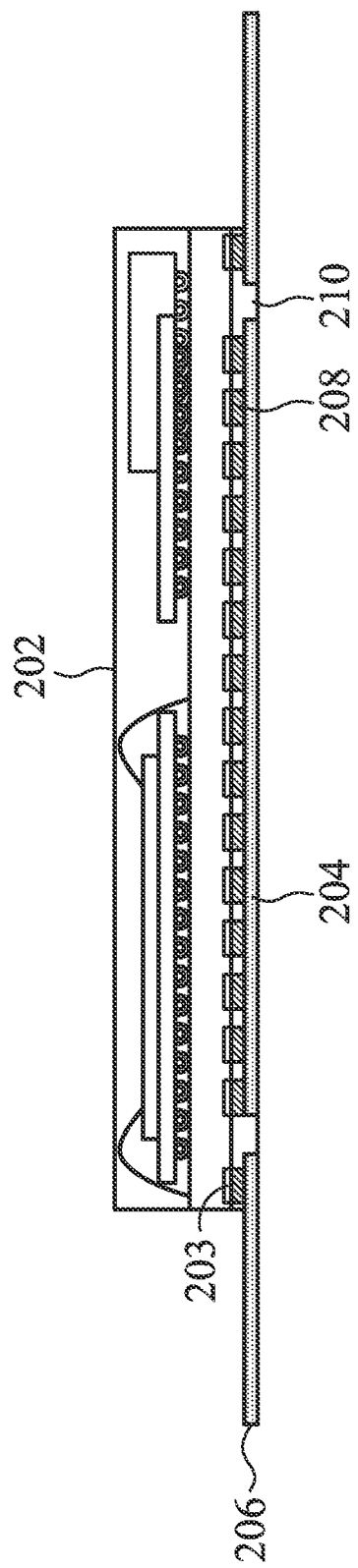
FIG. 3A shows a cross section a system in package assembly of an embodiment of the invention.
Figure 3B:
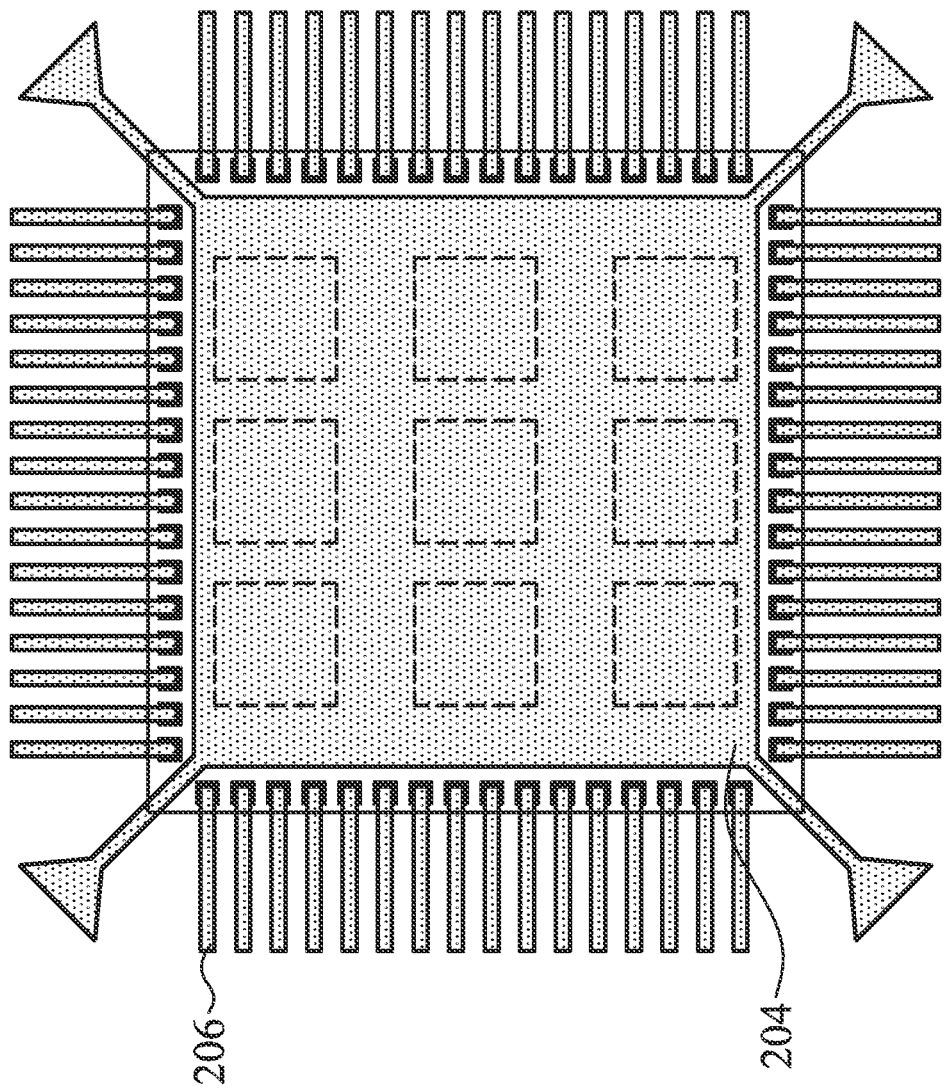
FIG. 3B shows a cross section a system in package assembly of an embodiment of the invention.

A method for forming a system in package assembly of an embodiment of the invention is illustrated in accordance with FIG. 2A~FIG. 2B and FIG. 3A~FIG. 3B. FIG. 2A and FIG. 3A show cross sections of a system in package assembly 200. FIG. 2B and FIG. 3B show bottom views of a system in package assembly 200. Referring to FIG. 2A and FIG. 2B, a system in package (SIP) module 202 is provided, wherein the system in package module 202 is in an integrated circuit (IC) package comprising one or more chips integrated with passive devices such as filters, capacitors, resistors or aerials. That is, a system in package module comprises various types of elements to be packed with circuit chips to constitute a more complicated and complete system. System in package can use multi-chip module (MCM) technology, multi-chip package (MCP) technology, stack die technology or the technology embedding active or passive devices in a substrate. The interconnection technology in a system in package can be wire bonding, chip flipping, or an anisotropic conductive film adhered to connect IC substrate. System in package comprises a plurality of chips, active devices and/or passive devices assembled in a package module, wherein the chips can be logic devices, memory devices, processors, base frequency devices and/or radio frequency devices. As shown in FIG. 2A and FIG. 2B, the system in package module 202 of the embodiment comprises bonding pads 203 at the bottom sides.

Next, referring to FIG. 3A and FIG. 3B, the bonding pads 203 of the system in package module is electrically connected to a lead frame 204 comprising pins 206. In an embodiment of the invention, the system in package module 202 can be electrically connected to the lead frame 204 though an anisotropic conductive film (ACF). Alternatively, the bonding pad 203 of the system in package module 202 can be bonded to the lead frame 204 by solders 208, and a space between the solder 208 and solder 208 can be filled with an underfill 210. In an embodiment of the invention, the underfill 210 can be epoxy. Another embodiment of the invention can use metallic bonding film through thermal lamination to bond the system in package module 202 to the lead frame 204.

Thereafter, a shape making step is performed for the lead frame to form a specific shape. In an embodiment of the invention, as shown in FIG. 4A, the pins 402 can be substantially line-shaped from a cross sectional view. In another embodiment of the invention, as shown in FIG. 4B, the pins 404 can be substantially Z-shaped from a cross sectional view, wherein each of the pins 404 comprises a first portion 406, a second portion 408 and a third portion 410, and the second portion 408 is substantially perpendicular to the first portion 406 and the third portion 410. In a further embodiment of the invention, as shown in FIG. 4C, the pins 412 can be substantially arc-shaped from a cross sectional view.

Figure 1:
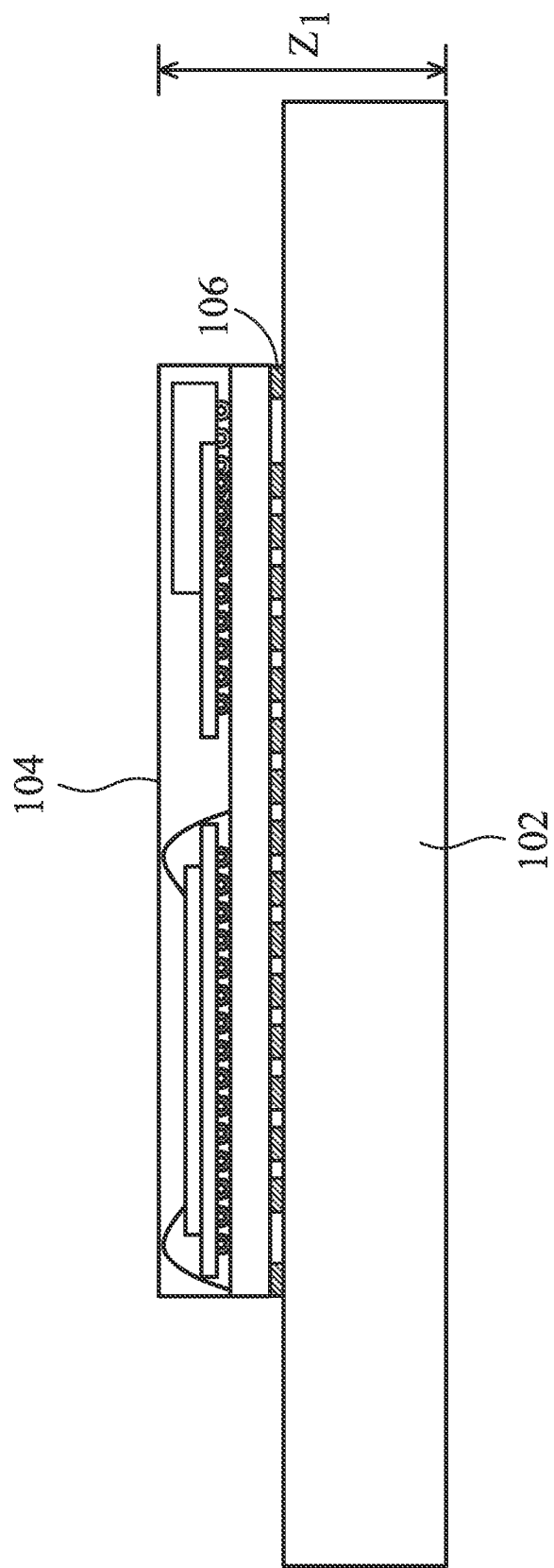
FIG. 1 shows a cross section of a conventional system in package assembly.
Figure 5:
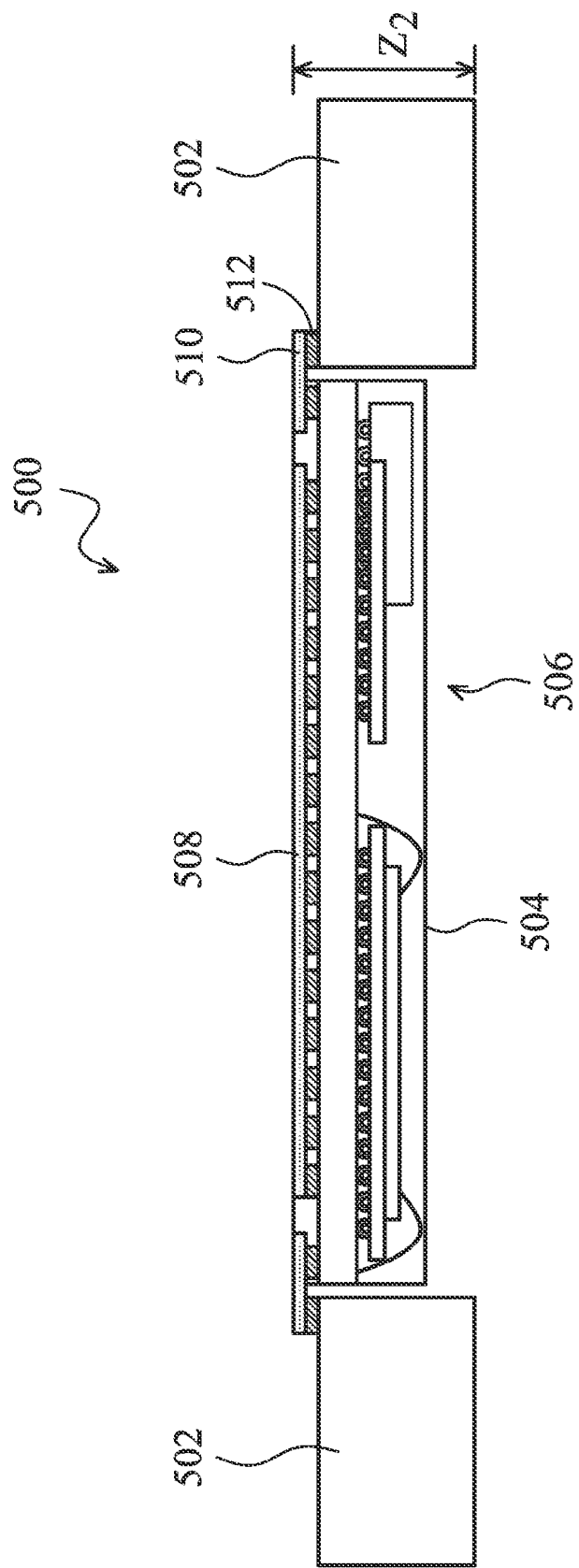
FIG. 5 shows a cross section of a structure of a system in package bonded with a printed circuit board of an embodiment of the invention.

A method for integrating a system in package assembly 500 of an embodiment of the invention to a printed circuit board is illustrated in accordance with FIG. 5. Referring to FIG. 5, in an embodiment with thickness of the printed circuit board 502 greater than thickness of the system in package module 504, the pins 510 of the lead frame 508 of the system in package assembly 500 can be formed to be a line shape. Therefore, as shown in FIG. 5, the system in package module 504 can be placed upside down and embedded into the opening 506 of the printed circuit board 502, and the pins 510 can be bonded to the printed circuit board 502 through the solders 512. Referring to FIG. 1 and FIG. 5, the printed circuit board assembly comprising a stack of a printed circuit board and a system in package of the conventional technology has a total thickness $Z_1$. The printed circuit board 502 assembly comprising a printed circuit board 502 and a system in package module 504 of the embodiment of the invention has a total thickness $Z_2$. $Z_2$ is obviously less than $Z_1$.

Figure 6:
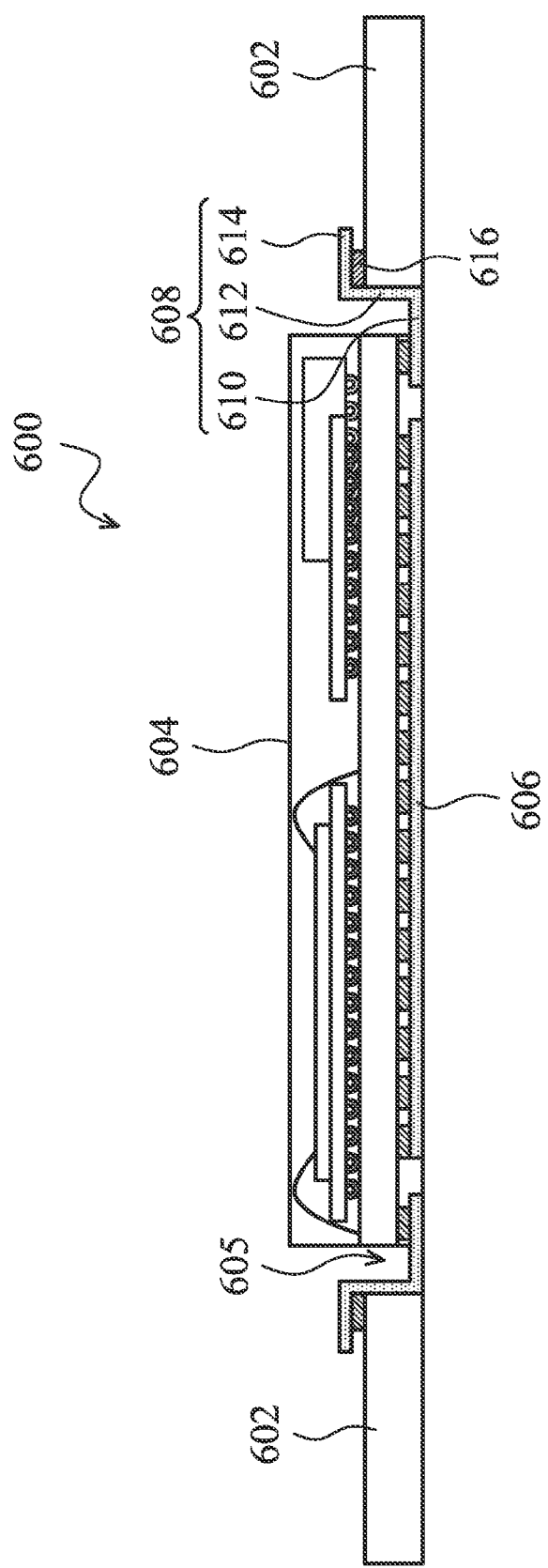
FIG. 6 shows a cross section of a structure of a system in package bonded with a printed circuit board of another embodiment of the invention.

A method for integrating a system in package assembly 600 of another embodiment of the invention to a printed circuit board is illustrated in accordance with FIG. 6. Referring to FIG. 6, in an embodiment with thickness of the printed circuit board 602 less than thickness of the system in package module 604, the pins 608 of the lead frame 606 of the system in package assembly 600 can be formed to be substantially a Z shape, wherein each of the pins 608 of the lead frame 606 comprises a first portion 610, a second portion 612 and a third portion 614, and the second portion 612 is substantially perpendicular to the first portion 610 and the third portion 614. As shown in FIG. 6, the system in package module 604 can be embedded into the opening 605 of the printed circuit board 602, and the third portion 614 of the pins 608 can be bonded to the printed circuit board 602 through the solders 616.

Figure 7:
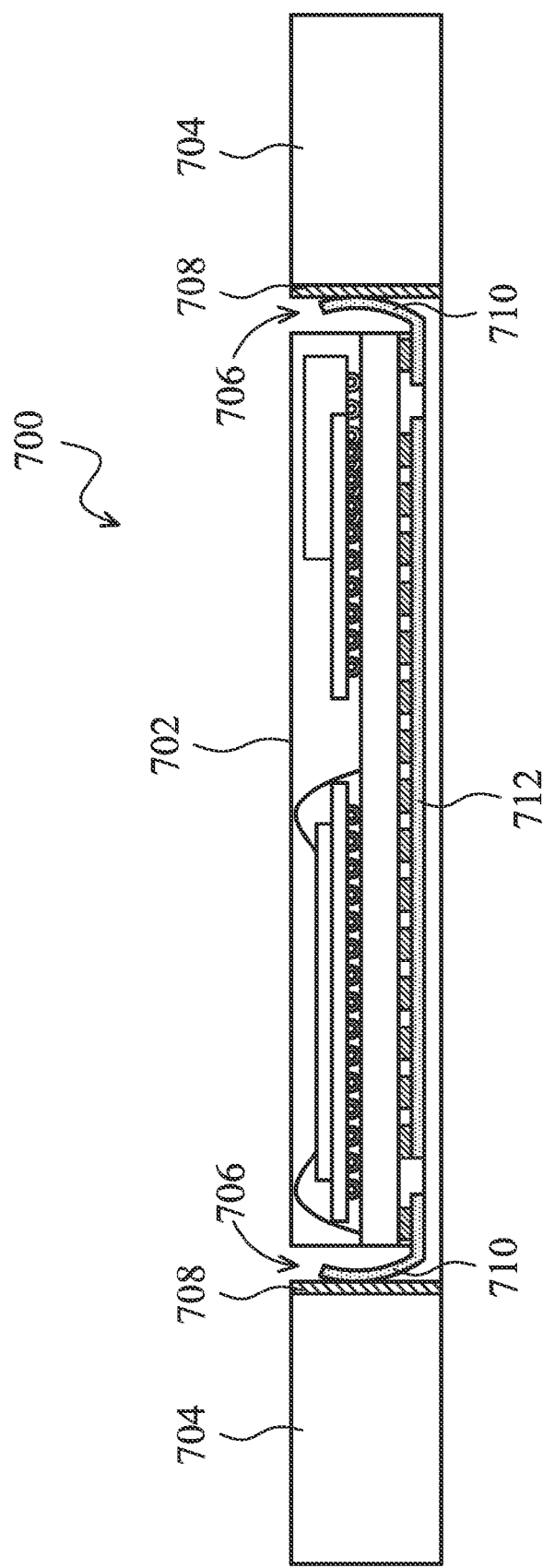
FIG. 7 shows a cross section of a structure of a system in package bonded with a printed circuit board of further another embodiment of the invention.
Figure 8:
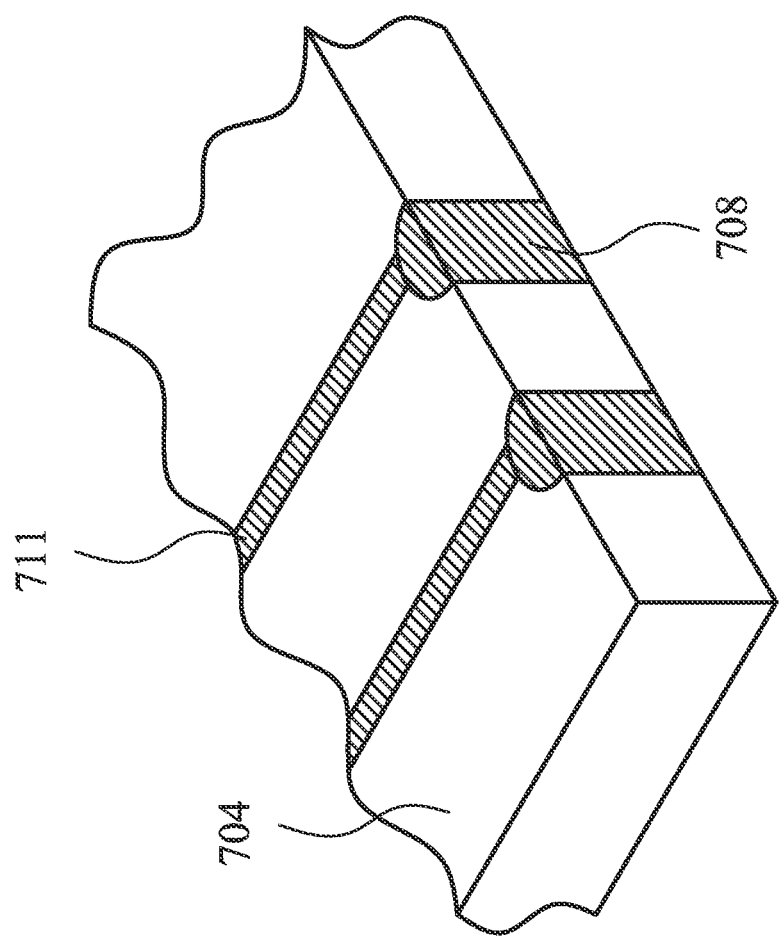
FIG. 8 shows a three dimensional figure of a printed circuit board comprising a conductive sidewall of an embodiment of the invention.

A method for integrating a system in package assembly 700 of further another embodiment of the invention to a printed circuit board assembly is illustrated in accordance with FIG. 7. Referring to FIG. 7, the embodiment can form an opening 706 with conductive sidewalls 708 at two sides in the printed circuit board 704, and as shown in FIG. 8, the conductive sidewalls 708 can be vias formed with electroplating and then being cut through to have semi-circular shapes. Each of the semi-circular vias comprises an arc-shaped side and a flat surface side, wherein the flat surface side is exposed in the opening 706 of the printed circuit board 704, and the semi-circular electroplating is electrically connected to a circuit 711 of the printed circuit board 704. Referring back to FIG. 7, in an embodiment, the pins 710 of the lead frame 712 of the system in package assembly 700 can be formed to be an arc shape. Therefore, the system in package assembly 700 can plug into the opening 706 of the printed circuit board 704, and the pins 710 of the lead frame 712 can electrically connect to the circuit 711 of the printed circuit board 704 through the conductive sidewall 708. It is noted that if the system in package assembly 700 is found to have an issue or the structure of the system is to be changed, amendments or replacements of the system in package assembly 700 is easy. In addition, the embodiment can further use a stopper apparatus or adhering apparatus (not shown) for the pins for alignment to the conductive sidewall and/or provide a better connection.

According to the description above, the system in package assembly of the embodiments of the invention have the following advantages. First, the system in package assembly has advantages of having a small size, being easy to be reworked and not requiring use of mechanical parts. Second, the invention can improve heat sink of traditional system in package assemblies by providing heat sink through lead frames having good heat-sink characteristics. Third, if some issues are found in the system in package assembly of the invention or the structure of the system is to be changed, the system in package assembly can be easily modified or replaced. Fourth, the total thickness of the system in package assembly of the invention integrated with a print circuit board is less than that of traditional technology.

While the invention has been described by way of example and in terms of the preferred embodiments, it is to be understood that the invention is not limited to the disclosed embodiments. It is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A printed circuit board assembly, comprising:
a printed circuit board comprising at least one opening; and
a system in package assembly, comprising:
a system in package module; and
a lead frame bonded to the system in package module, wherein the lead frame comprises a plurality of pins,
wherein the system in package assembly is embedded into the opening of the printed circuit board,
wherein the pins have a substantially arc shape from a cross sectional view, wherein the printed circuit board has a conductive sidewall in the opening, and the pins are electrically connected to the conductive sidewall, and wherein the conductive sidewall is a semi-circular-shaped electroplating via, comprising an arc-shaped side and a flat surface side, wherein the flat surface side is exposed in the opening of the printed circuit board.

* * * * *